United States Patent
Chen et al.

(10) Patent No.: US 11,329,008 B2
(45) Date of Patent: May 10, 2022

(54) METHOD FOR MANUFACTURING SEMICONDUCTOR PACKAGE FOR WARPAGE CONTROL

(71) Applicant: TAIWAN SEMICONDUCTOR MANUFACTURING COMPANY LTD., Hsinchu (TW)

(72) Inventors: Chen-Shien Chen, Hsinchu County (TW); Ming-Da Cheng, Taoyuan (TW); Ming-Chih Yew, Hsinchu (TW); Yu-Tse Su, Chiayi (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/028,862

(22) Filed: Sep. 22, 2020

(65) Prior Publication Data

US 2021/0013158 A1    Jan. 14, 2021

Related U.S. Application Data

(62) Division of application No. 15/901,355, filed on Feb. 21, 2018, now Pat. No. 10,797,005.

(60) Provisional application No. 62/590,950, filed on Nov. 27, 2017.

(51) Int. Cl.
| | |
|---|---|
| *H01L 23/00* | (2006.01) |
| *H01L 23/52* | (2006.01) |
| *H01L 27/02* | (2006.01) |
| *H01L 23/538* | (2006.01) |
| *H01L 23/498* | (2006.01) |
| *H01L 21/683* | (2006.01) |
| *H01L 23/31* | (2006.01) |

(52) U.S. Cl.
CPC ........ *H01L 23/562* (2013.01); *H01L 21/6835* (2013.01); *H01L 23/49827* (2013.01); *H01L 23/52* (2013.01); *H01L 23/5389* (2013.01); *H01L 24/95* (2013.01); *H01L 27/0203* (2013.01); *H01L 23/3128* (2013.01); *H01L 23/49816* (2013.01); *H01L 2221/68345* (2013.01); *H01L 2221/68354* (2013.01); *H01L 2224/18* (2013.01); *H01L 2924/10253* (2013.01); *H01L 2924/1431* (2013.01); *H01L 2924/3511* (2013.01)

(58) Field of Classification Search
CPC ..................................................... H01L 23/562
See application file for complete search history.

(56) References Cited

U.S. PATENT DOCUMENTS

| | | | |
|---|---|---|---|
| 7,871,899 B2* | 1/2011 | Rinne | ...................... H01L 21/78 438/457 |
| 2009/0309212 A1* | 12/2009 | Shim | ................... H01L 23/3107 257/700 |
| 2013/0119552 A1* | 5/2013 | Lin | ......................... H01L 24/94 257/774 |

* cited by examiner

*Primary Examiner* — Ajay Arora
(74) *Attorney, Agent, or Firm* — WPAT, P.C., Intellectual Property Attorneys; Anthony King

(57) ABSTRACT

A method for manufacturing a semiconductor package includes following operations. A die having a first surface and a second surface opposite to the first surface is provided. A polymeric film is disposed over the second surface of the die. An adhesive film is provided. The die and the polymeric film are attached to a carrier substrate through the adhesive film. The die, the polymeric film and the adhesive film are molded with a molding compound. The polymeric film is sandwiched between the die and the adhesive film upon attaching to the carrier substrate.

20 Claims, 8 Drawing Sheets

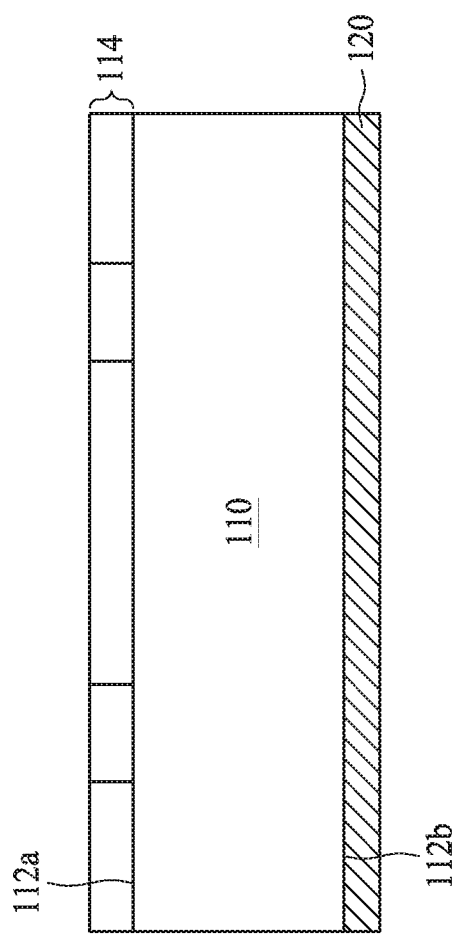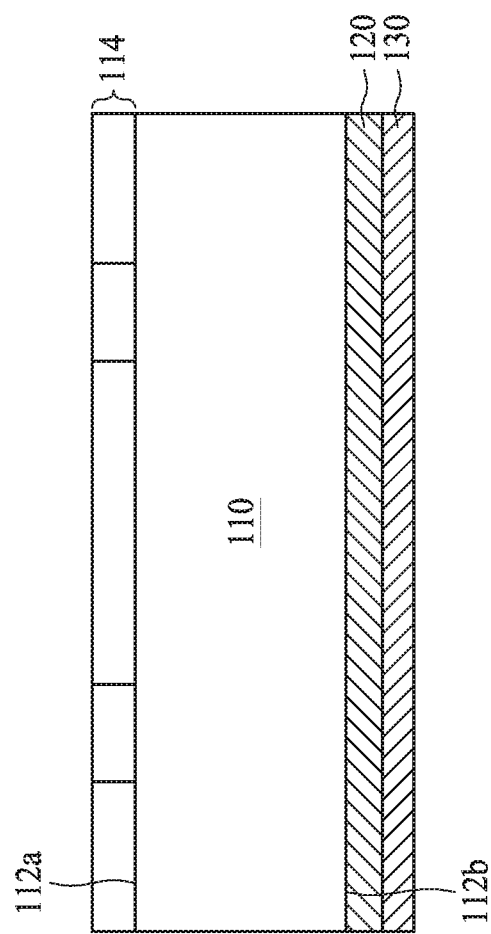

Method for Manufacturing Semiconductor Package for Warpage Control

PRIORITY DATA

This patent is a divisional application of U.S. patent application Ser. No. 15/901,355 filed on Feb. 21, 2018, entitled of "SEMICONDUCTOR PACKAGE AND METHOD FOR MANUFACTURING THE SAME", which claims the benefit of U.S. Provisional Patent Application Ser. No. 62/590,950 filed Nov. 27, 2017, the entire disclosure of which is hereby incorporated by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers over a semiconductor substrate, and patterning the various material layers using lithography to form circuit components and elements thereon. As the semiconductor industry continues to improve the integration density of various electronic components (e.g., transistors, diodes, resistors, capacitors, etc.) by continual reduction of minimum feature size, more components are allowed to be integrated into a given chip area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limitations to the density that can be achieved in two dimensions. One of these limitations is the minimum size needed to make these components. Also, when more devices are put into one chip, more complex designs are required.

Three-dimensional integrated circuits (3DICs) were thus formed, wherein two dies or packages may be stacked, with through vias formed in one of the dies or packages to connect the other die to another substrate. Package on Package (PoP) is becoming an increasingly popular integrated circuit packaging technique because it allows for higher density electronics.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A through 3G illustrate sectional views of a semiconductor package at various fabrication stages constructed according to aspects of the present disclosure in one or more embodiments.

DETAILED DESCRIPTION

Figure 1:
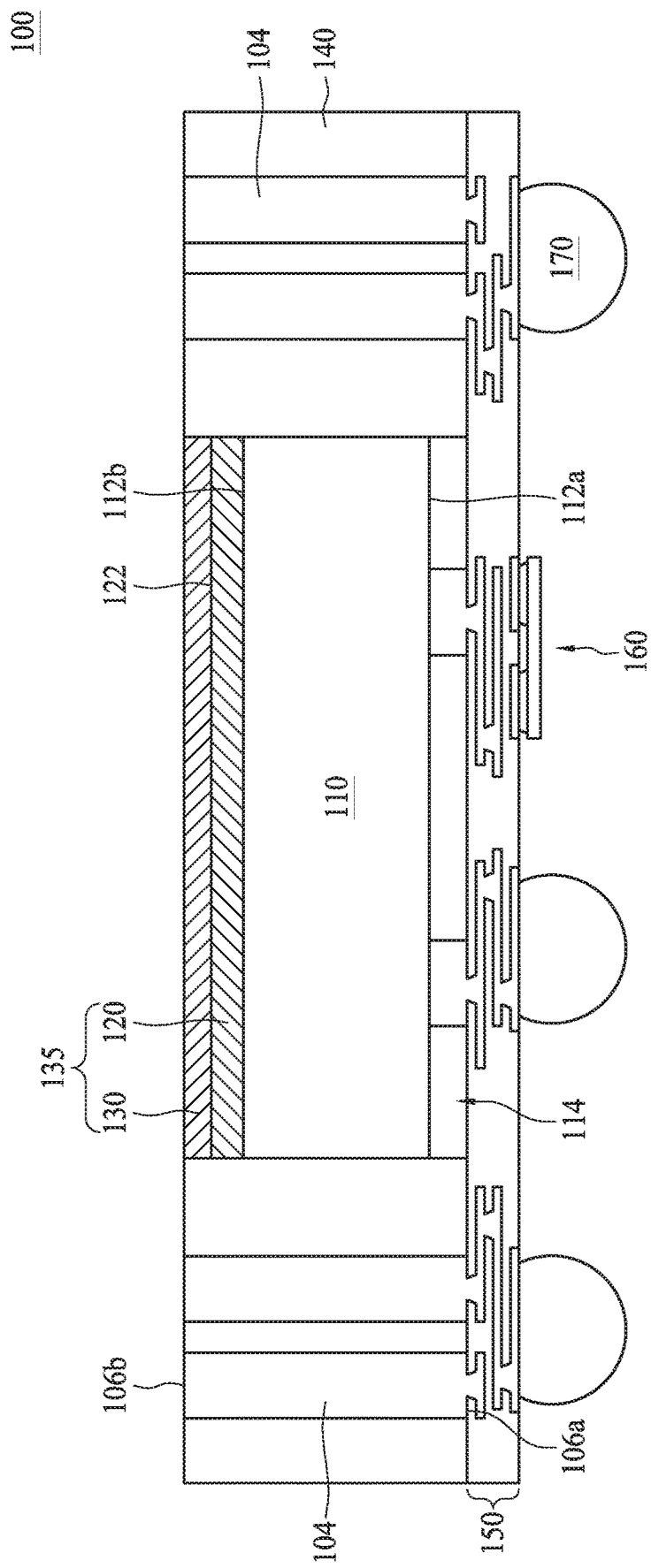
FIG. 1 is a schematic cross sectional view of a semiconductor structure according to aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to +10°, such as less than or equal to ±5°, less than or equal to ±4°, less than or equal to ±3°, less than or equal to ±2°, less than or equal to ±1°, less than or equal to ±0.5°, less than or equal to +0.1°, or less than or equal to +0.05°. For example, "substantially" perpendicular can refer to a range of angular variation relative to 90° that is less than or equal to ±10°, such as less than or equal to ±5°, less than or equal to ±4°, less than or equal to ±3°, less than or equal to +2°, less than or equal to +1°, less than or equal to +0.5°, less than or equal to ±0.1°, or less than or equal to ±0.05°.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Due to varying coefficients of thermal expansion (CIEs) of different elements in a semiconductor package, the semiconductor package may bow upward or downward. Such bowing or warpage is not desirable for forming package on package (PoP) structure, because warpage could cause metal/dielectric interfacial delamination and thus affect reliability of connections between components. In addition, warpage of the semiconductor package could break portions of RDLs to degrade yield.

Furthermore, warpage of the semiconductor package creates not only defects as mentioned above, but also handling issues during manufacturing. Warpage of a semiconductor package is related to a ratio between the die (mainly including Si) and the molding compound. Warpage is also related to a ratio between the die and the whole package, that is the fan-out ratio. For semiconductor packages of different fan-out ratios, it needs to collocate different carrier substrates including different CTEs for in-line warpage control. For example, a carrier substrate including a CTE of about 9 ppm/° C. is required when the fan-out ratio is about 2.5, a carrier substrate including a CTE of about 7 ppm/° C. is required when the fan-out ratio is about 2, and another carrier substrate including a CTE of about 5 ppm/° C. is required when the fan-out ratio is about 1. It is found that semiconductor packages of different fan-out ratios require carrier substrates of different CTEs, and thus cause low usage rate for the carrier substrates, and increase idle time for the carrier substrates. Additionally, semiconductor package in large size is more likely subject to warpage defects. Therefore, it is desirable to reduce warpage during manufacturing of the semiconductor package.

One or more implementations of the present invention will now be described with reference to the attached drawings, Wherein like reference numerals are used to refer to like elements throughout, and wherein the illustrated structures are not necessarily drawn to scale. As used herein, the terms "die" and "chip" are interchangeable throughout the specification.

Referring to FIG. 1, which is a schematic cross sectional view of a semiconductor structure according to aspects of the present disclosure. A semiconductor package 100 is provided. The semiconductor package 100 includes a die 110 including a first surface 112a and a second surface 112b opposite to the first surface 112a. The semiconductor package 100 further includes an adhesive film 130 disposed over the second surface 112b of the die 110 and a polymeric film 120 sandwiched between the adhesive film 130 and the die 110. The semiconductor package 100 further includes a molding compound 140 surrounding the die 110, the polymeric film 120 and the adhesive film 130. In some embodiments of the present disclosure, the die 110 can be a logic die, a central processing unit (CPU) die, a memory die, or the like. The die 110 can include integrated circuit devices such as transistors, capacitors, inductors, resistors, and the like formed in a semiconductor substrate such as a Si substrate or over the first surface 112a. Generally, a CTE of the die 110 is referred to the CTE of Si, that is about 2.6 ppm/° C. Furthermore, a connecting structure 114 can be formed over the first surface 112a of the die 110. The connecting structure 114 includes at least one dielectric layer and at least one conductive lines formed therein. In some embodiments, the conductive line is a die pad.

In some embodiments of the present disclosure, the adhesive film 130 can be a die attach film (DAF), and can be suitable adhesive such as ultraviolet (UV) glue, which loses its adhesive property when exposed to UV lights. Other types of adhesives may also be used, such as adhesives that lose some adhesive properties when exposed to heat. The adhesive film 130 includes a CTE, and the CTE of the adhesive film 130 can be about 120 ppm/° C., but not limited to this. In some embodiments, the CTE of the adhesive film 130 is about 250 ppm/° C. In some embodiments, the adhesive film 130 is surrounded by the molding compound 140. In some embodiments, the adhesive film 130 is at least partially exposed from the molding compound 140. In some embodiments, a surface of the adhesive film 130 is exposed from the molding compound 140.

In some embodiments, the polymeric film 120 is configured to control warpage of the semiconductor structure 100. In some embodiments, the polymeric film 120 is a warpage adjustable film. In some embodiments, the polymeric film 120 is disposed over the die 110 and surrounded by the molding compound 140. In some embodiments, the polymeric film 120 entirely covers the second surface 112b of the die 110. In some embodiments, the polymeric film 120 is entirely covered by the adhesive film 130. In some embodiments of the present disclosure, a thickness of the polymeric film 120 is ranged from about 20 micrometers (μm) to about 100 μm. And in other embodiments of the present disclosure, the thickness of the polymeric film 120 is ranged from about 20 μm to about 60 μm. In some embodiments of the present disclosure, a CTE of the polymeric film 120 is between the CTE of the adhesive film 130 and the CTE of the die 110. Therefore in some embodiment of the present disclosure, the CTE of the polymeric film 120 is between 2.6 ppm/° C. and 120 ppm/° C., but not limited to this. In some embodiments, a CTE of the polymeric film 120 is ranged from about a CTE at the temperature less than the glass transition temperature (Tg) (CTE1) to about a CTE at the temperature of the Tg or more (CTE2). For example, a CTE of the polymeric film 120 is ranged from about 15 ppm/° C. (CTE1) to about 57 ppm/° C. (CTE2), but not limited to this. In some embodiments of the present disclosure, the polymeric film 120 can include a polymer-based material with fillers such as epoxy resin with filler, orphenol resin with filler, or other material having similar insulating and structural properties. As shown in FIG. 1, an interface 122 between the adhesive film 130 and the polymeric film 120, which laterally extends over the second surface 112b of the die 110 and substantially perpendicular to a sidewall of the polymeric film 120 and a sidewall of the adhesive film 130, is surrounded by the molding compound 140. In some embodiments, the interface 122 is substantially parallel to the second surface 112b of the die 110.

The molding compound 140 is applied to protect the die 110 and provide mechanical stiffness and enhance the mechanical strength of the semiconductor package 100. The molding compound 140 may include any suitable material such as an epoxy resin, a molding underfill, or the like. The molding compound may include a CTE in a range of about 9-41 ppm/° C. In some embodiments of the present disclosure, the CTE of the polymeric film 120 is closer to the CTE of the molding compound 140 than to the CTE of the die 110. In some embodiments of the present disclosure, the CTE of the polymeric film 120 is also closer to the CTE of the molding compound 140 than and to the CTE of the adhesive film 130. For example, the CTE value was considered to have reliability up to glass transition (Tg) temperature. The CIE of the polymeric film 120 is about 15 ppm/° C. below its Tg temperature, which is about 113° C. It is closer to the CTE of the molding compound 140, which is about 9 ppm/° C. below its Tg temperature, than to the CTE of the die 110, which is about 2.6 ppm/° C. The CTE of the polymeric film 120 is also closer to the CTE of the molding compound 140 than to the CTE of the adhesive film 130, which is about 120 ppm/° C. below its Tg temperature. As mentioned above, the polymeric film 120 can include a polymer-based material with fillers. In some embodiments of the present disclosure, the polymeric-based material can include materials the same with those used in the adhesive film 130. However, by adding the fillers into the polymeric-based material, characteristics such as the CTE of the polymeric film 120 is adjusted to be closer to the CTE of the molding compound 140. Therefore, the polymeric film 120 makes the warpage behavior more like the molding compound and is referred to as a warpage adjustable portion. Accordingly, in some embodiments of the present disclosure, a warpage control unit 135 including the warpage adjustable portion 120 and the adhesive portion 130 is provided.

In some embodiments of the present disclosure, the semiconductor package 100 includes a plurality of through vias 104 in the molding compound 140. The through vias 104 may be formed of any suitable conductive material, including copper (Cu), silver (Ag), nickel (Ni), platinum (Pt), aluminum (Al), lead-free solder (e.g., SnAg, SnCu, SnAgCu), combination thereof, or the like. As shown in FIG. 1, each of the through vias 140 extended through the molding compound 140 includes a first end 106a and a second end 106b opposite to the first end 106a. The first end 106a and the second end 106b are exposed from the molding compound 140, thereby allowing electrical connections to be made to the through vias 104.

The semiconductor package 100 further includes at least an interconnect structure 150. The interconnect structure 150 is formed over the first surface 112a of the die 110 and the molding compound 140. The interconnect structure 150 can include one or more redistribution layers (RDLs), and the RDL can include a layer of a dielectric layer having conductive lines formed therein. The dielectric layer can include, for example but not limited to, a polymer material, such as epoxy, polyimide, polybenzoxazole (PBC)), and the like, or can be formed of commonly known dielectric materials, such as spin-on glass, silicon oxide (SiO), silicon oxynitride (SiON), or the like. The conductive lines can include a metal such as Cu, Ag, Al, Ni, combination thereof, or the like. The interconnect structure 150 is electrically coupled to the die 110 through the connecting structure 114. And the interconnect structure 150 is electrically coupled to the first end 106a of the through vias 104 as shown in FIG. 1.

The semiconductor package 100 further includes a plurality of electrical conductors 170 disposed over and electrically coupled to the interconnect structure 150. The electrical conductors 170 are solder balls, metal pads, metal pillars, and/or combination thereof, and may be formed of Au, Ag, Ni, W, Al, and/or alloys thereof. Additionally, an under-ball metallurgy (UBM) (not shown) can be formed between the interconnect structure 150 and the electrical conductors 170. Generally, the UBM is a conductive pad formed upon the interconnect structure 150 and upon which the electrical conductors 170 are placed. In some embodiments of the present disclosure, a package component 160 including passive devices, which may include resistors, capacitors, inductors, and/or the like can be disposed over and electrically coupled to the interconnect structure 150 as shown in FIG. 1.

Figure 2:
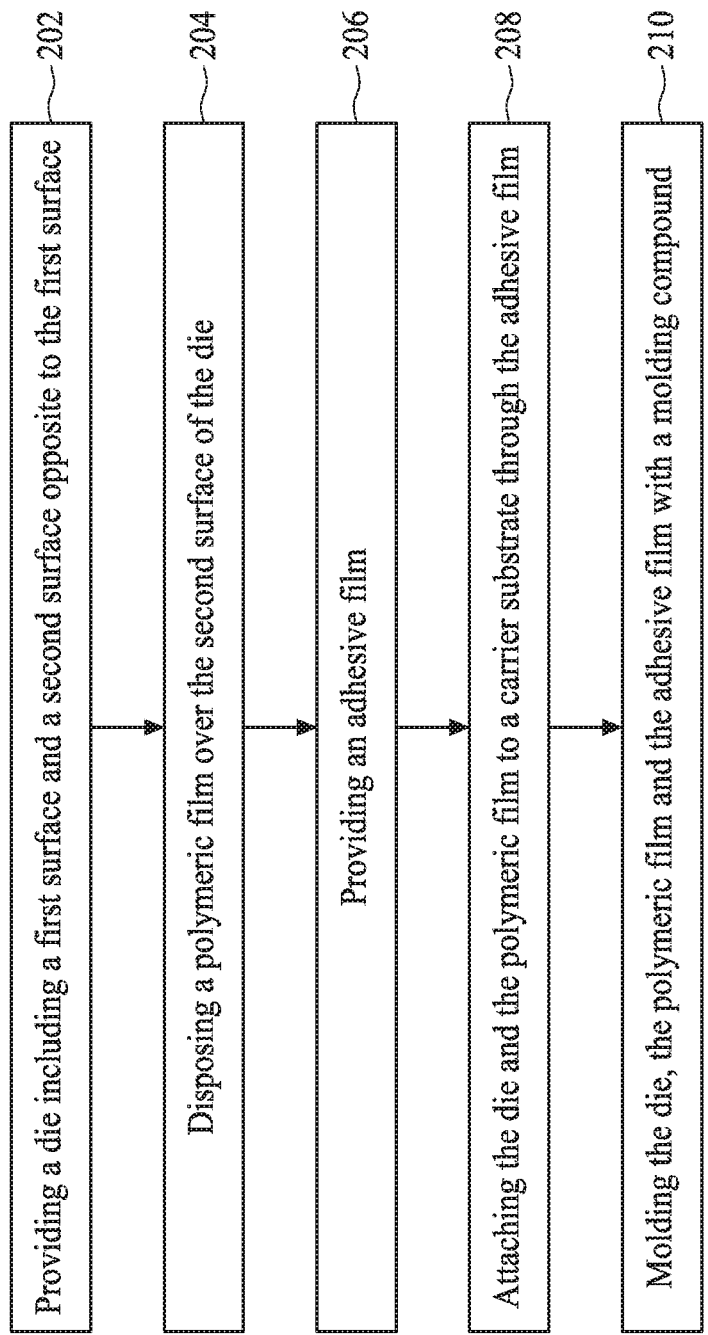
FIG. 2 is a flow chart representing a method for manufacturing a semiconductor package according to aspects of the present disclosure.

FIG. 2 is a flow chart representing a method for manufacturing a semiconductor package according to aspects of the present disclosure in one embodiment. The method for manufacturing the semiconductor package 20 includes an operation 202, providing a die including a first surface and a second surface opposite to the first surface. The method for manufacturing the semiconductor package 20 further includes an operation 204, disposing a polymeric film over the second surface of the die. The method for manufacturing the semiconductor package 20 further includes an operation 206, providing an adhesive film. The method of manufacturing the semiconductor structure for the memory device 20 further includes an operation 208, attaching the die and the polymeric film to a carrier substrate through the adhesive film. The method of manufacturing the semiconductor structure for the memory device 20 further includes an operation 210, molding the die, the polymeric film and the adhesive film with a molding compound. The method for manufacturing the semiconductor package 20 is further described according to one or more embodiments.

FIGS. 3A through 3G illustrate sectional views of a semiconductor package 100 at various fabrication stages constructed according to aspects of the present disclosure in some embodiments.

Figure 3A:
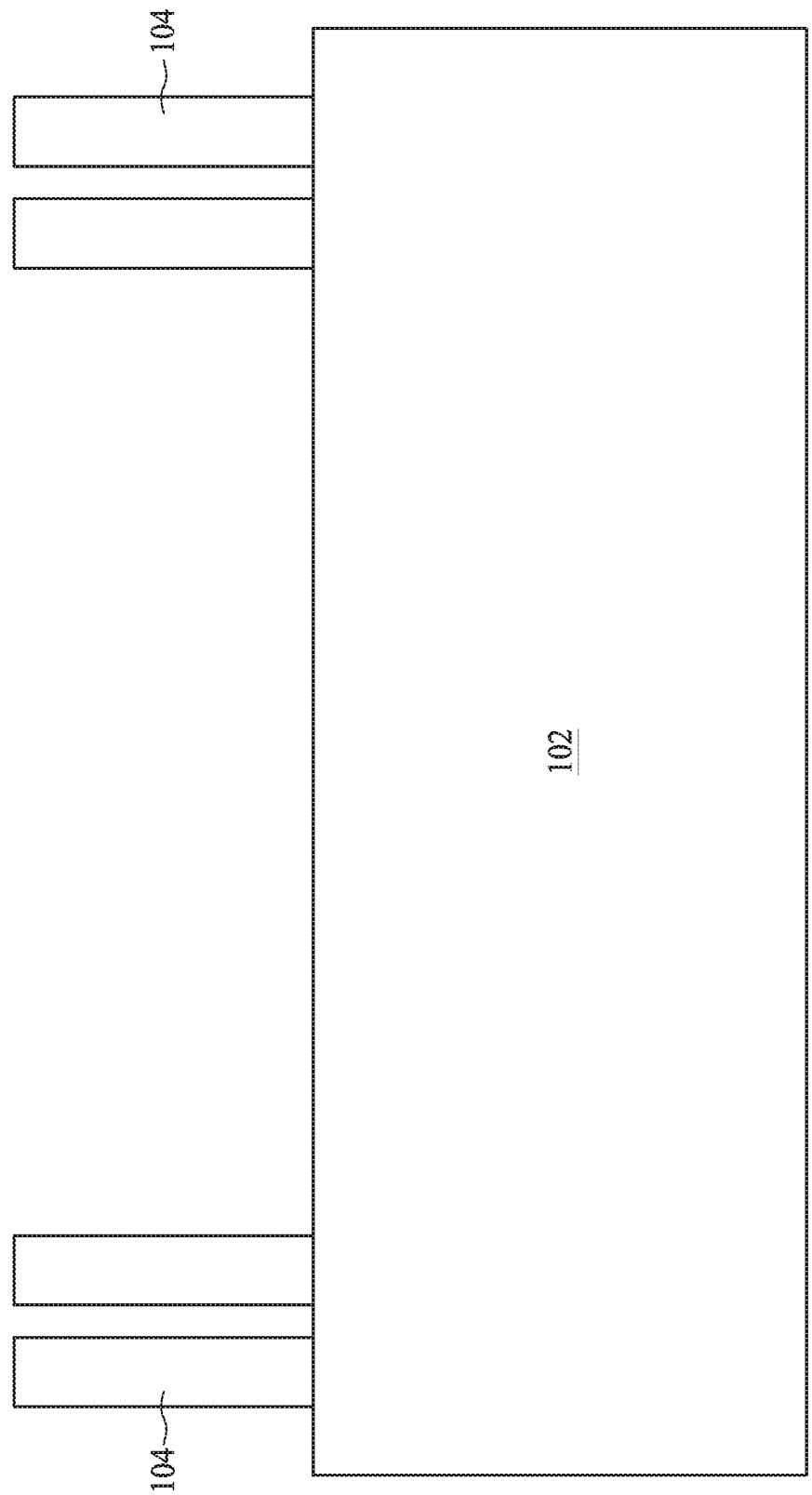

Referring to FIG. 3A, a carrier substrate 102 is provided. Generally, the carrier substrate 102 provides temporary mechanical and structural support during subsequent processing steps, such as those described in detail below. The carrier substrate 102 may be formed of any suitable materials including, for example but not limited to, glass, silicon oxide, aluminum oxide, a combination thereof, and/or the like.

In some embodiments of the present disclosure, some conductive posts 104 are formed on the carrier substrate 102. The conductive posts 204 can be formed by, for example but not limited to, the following operations: A patterned mask (not shown) can be formed on the carrier substrate 102 to define the shape and locations of the conductive posts 104 through a molding compound, which will be further described in the following, thereby providing an electrical connection between two opposite sides of the package. The patterned mask may be a patterned photoresist mask, a patterned hard mask, a combination thereof, or the like. The conductive posts 104 may be formed through any number of suitable techniques, including electroplating, physical vapor deposition (PVD), chemical vapor deposition (CVD), electrochemical deposition (ECD), molecular beam epitaxy (MBE), atomic layer deposition (ALD), and the like. It should be noted that in some embodiments, such as those that deposit a conformal layer over the entire surface of the wafer (e.g., PVD and CVD), it may be desirable to perform an etching or planarization operation (e.g., chemical mechanical polishing (CMP)) to remove excess conductive material from the surface of the patterned mask.

The patterned mask is then removed. In some embodiments the patterned mask is formed from photoresist materials, and the patterned photoresist mask may be stripped by, for example but not limited to, a chemical solution such as a mixture of ethyl lactate, anisole, methyl butyl acetate, amyl acetate, cresol novolak resin, and diazo photoactive compound (referred to as SPR9), or another stripping process. In some embodiments the patterned photoresist mask may be stripped using a mixture of a solvent (e.g., dimethyl sulfoxide (DMSO)), an alkaline (e.g., potassium hydroxide KOH or tetramethylammonium hydroxide (TMAH), and a surfactant additive.

Referring to FIG. 3B, at least one die 110 is provided according to operation 202. The die 110 includes a first surface 112a and a second surface 112b opposite to the first surface 112a. A connecting structure 114 can be formed over the first surface 112a of the die 110. As mentioned above, the connecting structure 114 includes at least one dielectric layer and conductive lines formed therein. In some embodiments, the conductive line is a die pad.

Still referring to FIG. 3B, a polymeric film 120 is disposed over the second surface 112b of the die 110 according to operation 204. The polymeric film 120 may be applied via lamination, spin coating, or other suitable techniques. As shown in FIG. 3B, the second surface 112b of the die 110 is entirely covered by the polymeric film 120.

Referring to FIG. 3C, an adhesive film 130 is formed over the polymeric film 120 and over the second surface 112b of the die 110 according to operation 206. Accordingly, the polymeric film 120 is sandwiched between the adhesive film 130 and the die 110 as shown in FIG. 3C. In some embodiments of the present disclosure, the adhesive film 130 can be applied via lamination, spin coating, or other suitable technique.

Figure 3D:
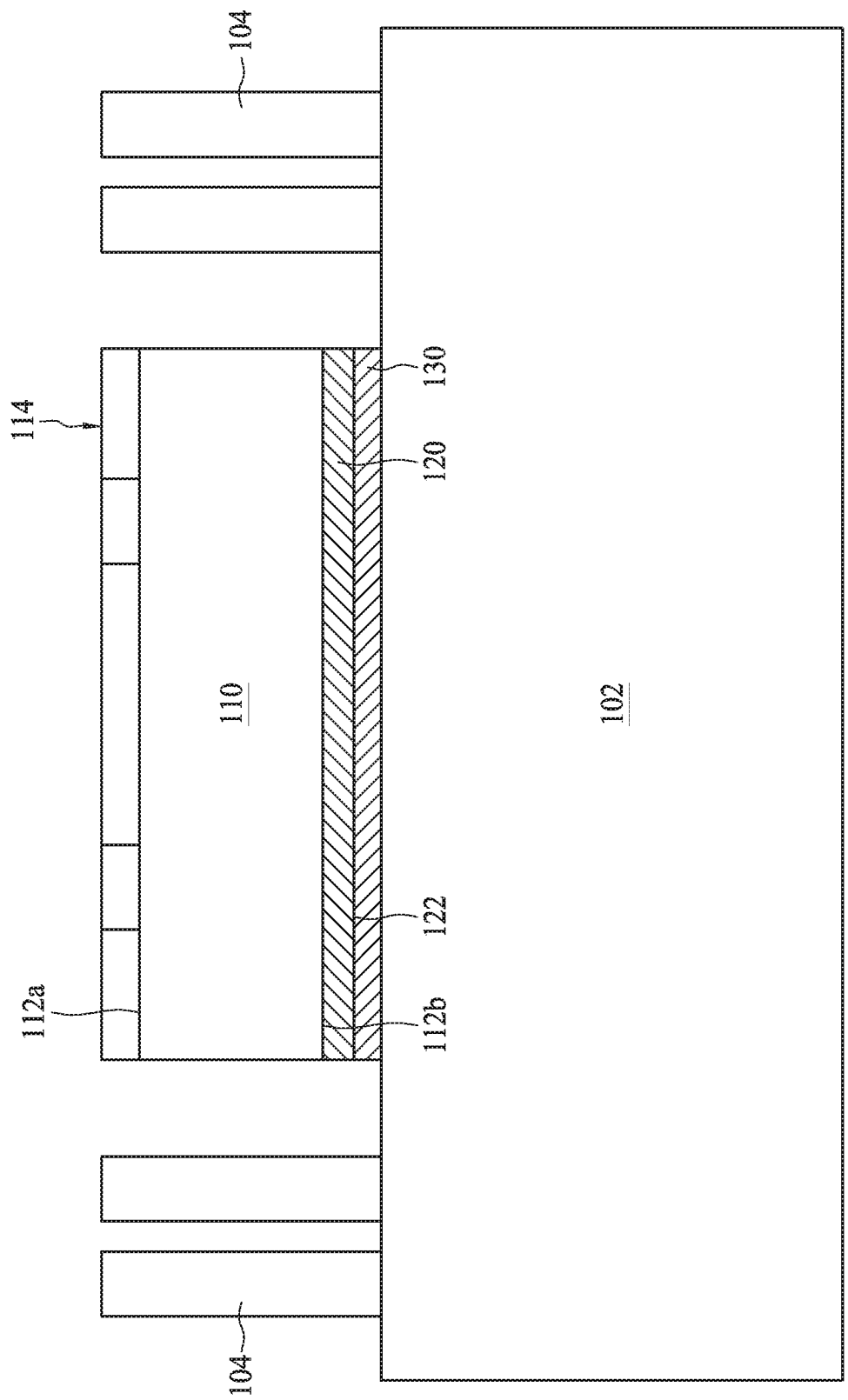

Referring to FIG. 3D, the die 110 and the polymeric film 120 are then attached to the carrier substrate 102 through the adhesive film 130 according to operation 208. As shown in FIG. 3D, the polymeric film 120 is sandwiched between the adhesive film 130 and the die 110 upon attaching to the carrier substrate 102.

Figure 3E:
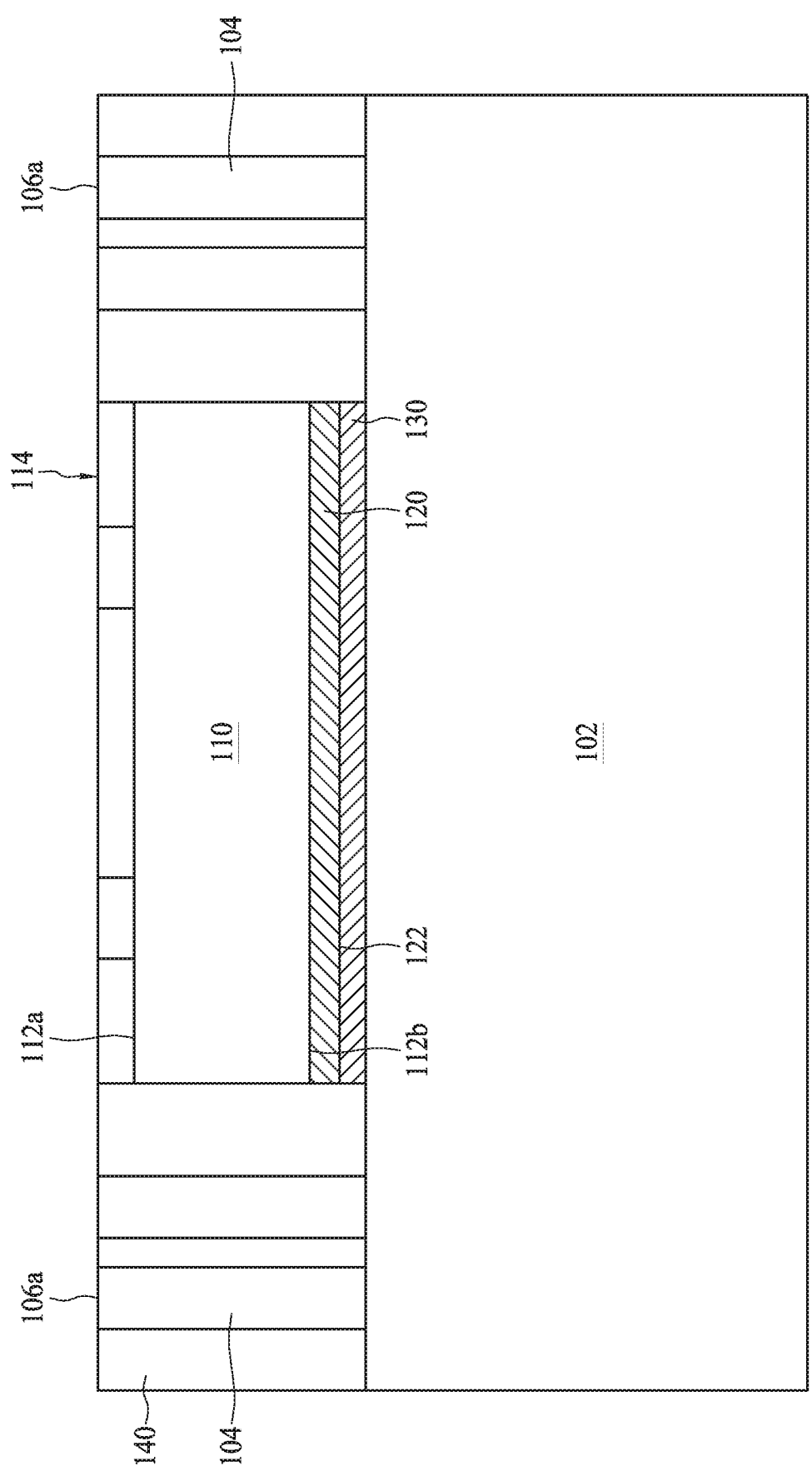

Referring to FIG. 3E, the die 110, the polymeric film 120, the adhesive film 130, and the conductive posts 104 are molded with a molding compound 140 according to the operation 210. As shown in FIG. 3E, the molding compound 140 surrounds the die 110, the polymeric film 120 and the adhesive film 130. Also, an interface 122 between the adhesive film 120 and the polymeric film 130, which laterally extends over the second surface 112b of the die 110 and substantially perpendicular to a sidewall of the polymeric film 130 and a sidewall of the adhesive film 120, is surrounded by the molding compound 140. The molding compound 140 is applied to protect the die 110 and provide mechanical stiffness and enhance the mechanical strength of the semiconductor package 100. Suitable methods for forming the molding compound 140 may include compressive molding, transfer molding, liquid encapsulant molding, or the like. For example, the molding compound 140 may be dispensed between the die 110 and the conductive posts 104 in liquid form. Subsequently, a curing process is performed to solidify molding compound 140. The filling of the molding compound 140 may overflow over the die 110 so that the molding compound 140 covers a top surface of the die 110 and the conductive posts 104. In some embodiments of the present disclosure, a thinning operation is therefore performed to expose a first end 106a of each conductive post 140 to form through vias extended through the molding compound 140 and the top surface of the connecting structure 140, thereby allowing electrical connections to be made to the conductive posts/through vias 104 such as discussed in detail below.

It should be understood that the warpage of the semiconductor package 100 is related to a ratio between the die 110 (including Si) and the molding compound 140. The warpage is also related to a ratio between the die 110 and the whole package, that is the fan-out ratio. Therefore, in some embodiments of the present disclosure, a portion of the die 110 is removed, or, the die 110 is thinned from the second surface 112b before disposing the polymeric film 120. And a thickness of the portion of the die 110 being removed is substantially equal to a thickness of the polymeric film 120. In some embodiments of the present disclosure, when the fan-out ratio is relative low, a thinner polymeric film 120 is required. And in some embodiments, when the fan-out ratio is relative high, more Si is removed from the die 110, and a thicker polymeric film 120 is employed. The polymeric film 120 which includes the CTE closer to the CTE of the molding compound 140 modifies the warpage behavior over the area where the die 110 occupies. Consequently, warpage of the semiconductor package 100 is reduced. In other words, by adjusting the thickness of the die to yield some space and by providing a polymeric film with sufficient thickness to take up the space yielded from the die, warpage of the semiconductor packages of different fan-out ratios is reduced.

Additionally, for package of different fan-out ratios, it needs to collocate different carrier substrate including different CIEs for in-line warpage control. For example, a carrier substrate including a CTE of about 8.8 ppm/° C. is required when the fan-out ratio is about 2.32, and another carrier substrate including a CTE of about 5.1 ppm/° C. is required when the fan-out ratio is about 1.07. It is found semiconductor packages of different fan-out ratios require carrier substrate of different CTE, and thus cause low usage rate for the carrier substrates, and increase idle time in the prior art. However according to the embodiments of the present disclosure, since the warpage of the structure over the carrier substrate 102 is reduced by the polymeric film 120, choice of the carrier substrate 102 can be simplified, usage rate of the carrier substrate 102 is improved, and idle time of the carrier substrate 102 is reduced.

Figure 3F:
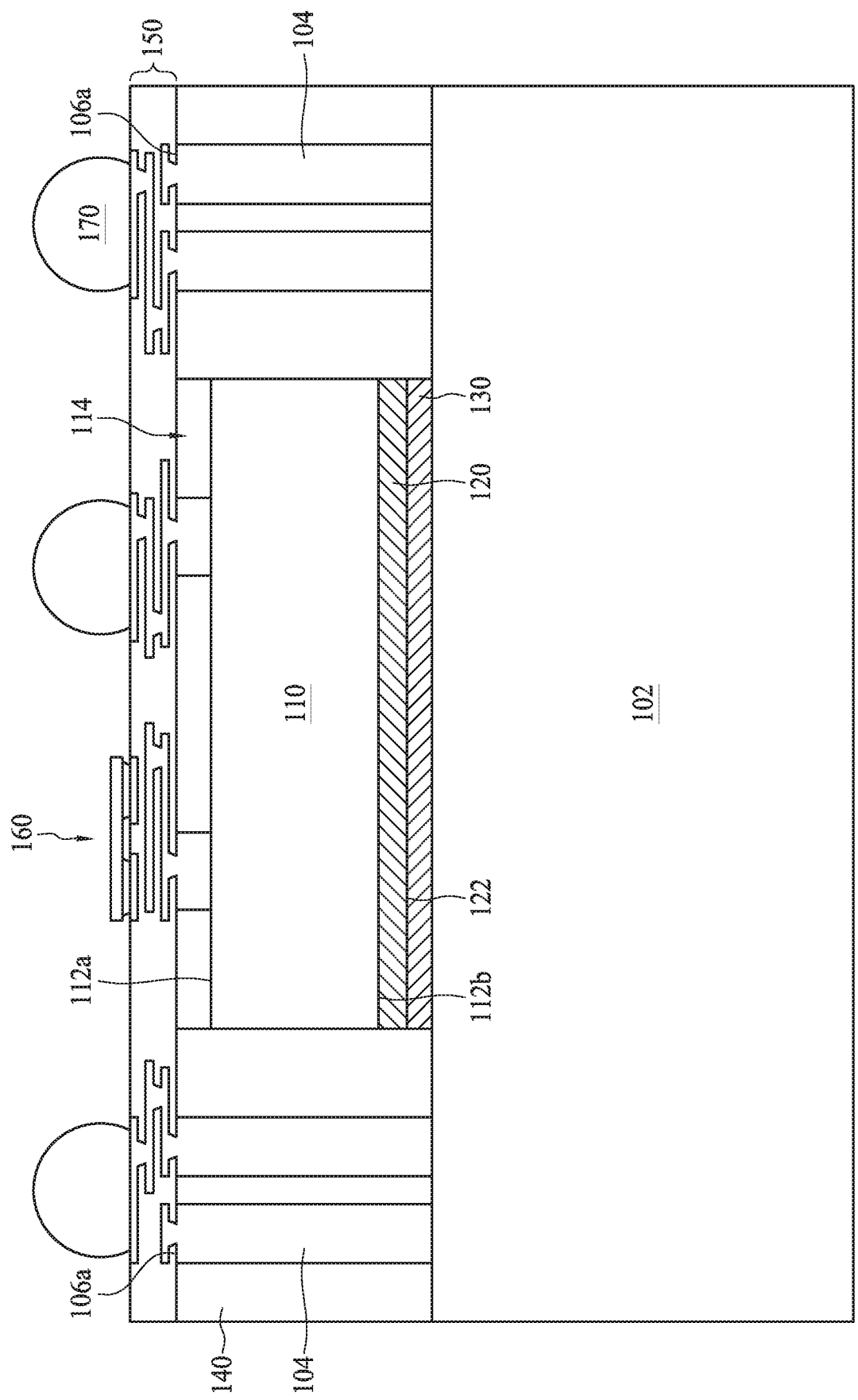

Referring to FIG. 3F, an interconnect structure 150 is formed over the first surface 112a of the die 110 and the molding compound 140. The interconnect structure 150 is electrically coupled to the die 110 through the connecting structure 114. And the interconnect structure 150 is electrically coupled to the first end 106a of the through vias 104 as shown in FIG. 3F.

Still referring to FIG. 3F, a plurality of electrical conductors 170 are disposed over and electrically coupled to the interconnect structure 150. In some embodiments of the present disclosure, a package component 160 including passive devices, which may include resistors, capacitors, inductors, and/or the like can be disposed over and electrically coupled to the interconnect structure 150 as shown in FIG. 3F.

Figure 3G:
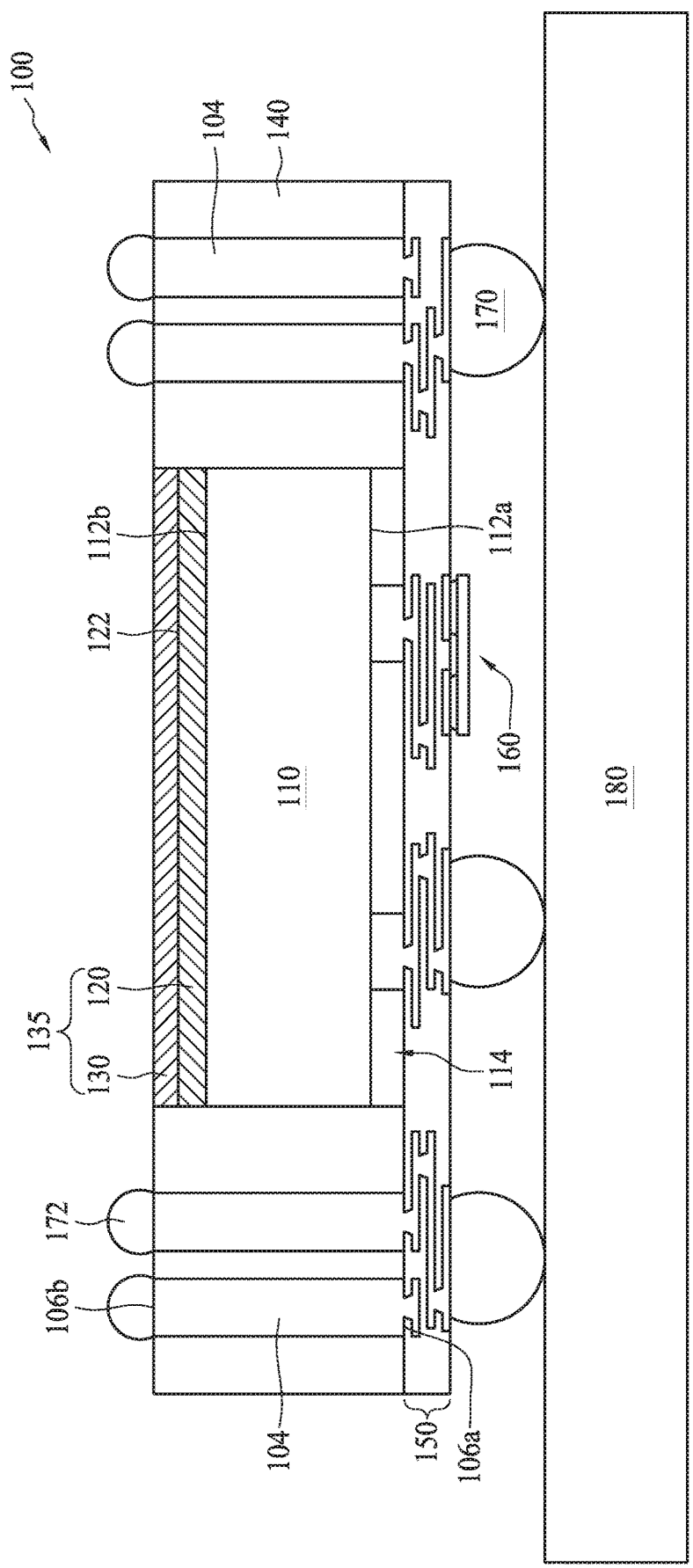

Referring to FIG. 3G, the semiconductor package 100 is de-bonded from the carrier substrate 102. In some embodiments of the present disclosure, the semiconductor package 100 is bonded to another substrate (not shown). Accordingly, a second end 106b opposite to the first end 106a of each conductive post/through-via 104 is exposed from a surface of the molding compound 140. And a plurality of electrical conductors 172 is formed over the molding compound 104 and electrically coupled to the conductive posts/through vias 104 at the second end 106b. Thus electrical connections of a component such as another integrated circuit die (not shown), which can be stacked on the semiconductor package 100, are constructed through the electrical conductors 172. Optionally, UBM may be formed on the exposed second ends 106b of the through vias 104 prior to forming the electrical conductors 172.

Still referring to FIG. 3G, the carrier substrate (not shown) is then de-bonded, and the semiconductor package 100 is affixed to a package substrate 180 such as a printed circuit board (PCB) or the like. The semiconductor package 100 is electrically coupled to the package substrate 180 through the electrical conductors 170 and the interconnect structure 150.

In the present disclosure, the polymeric film, that is the warpage adjustable film, is provided to cover the entire second surface of the die. The CTE of the warpage adjustable film is between the CTE of the die attach film and the die. Furthermore, the CTE of the warpage adjustable film is closer to the CTE of the molding compound than to the CTE of the die and the CTE of the die attach film. The warpage adjustable film over the second surface of the die makes the warpage behavior in this region more like the molding compound than the die, therefore the warpage of the whole semiconductor package is reduced. That is, a more flat semiconductor package is obtained, which in turn reduced poor jointing during die assembly. Furthermore, since the warpage is reduced, choice of the carrier substrate can be simplified and thus usage rate of the carrier substrate is improved and idle time of the carrier substrate is reduced.

In some embodiments, a method for manufacturing a semiconductor package is provided. The method includes following operations. A die having a first surface and a second surface opposite to the first surface is provided. A polymeric film is disposed over the second surface of the die. An adhesive film is provided. The die and the polymeric film are attached to a carrier substrate through the adhesive film. The die, the polymeric film and the adhesive film are molded with a molding compound. In some embodiments, the polymeric film is sandwiched between the die and the adhesive film upon attaching to the carrier substrate.

In some embodiments, a method for manufacturing a semiconductor package is provided. The method includes following operations. A die having a first surface and a second surface opposite to the first surface is provided. In some embodiments, a connecting structure is disposed over the first surface of the die. A warpage control unit is formed over the second surface of the die. The die and the warpage control unit are attached to a carrier substrate. In some embodiments, the carrier substrate includes at least a conductive post. The die, the warpage control unit and the conductive post are molded with a molding compound. The molding compound has a first surface facing the carrier substrate, and a second surface opposite to the first surface. The conductive post has a first surface facing the carrier substrate, and a second surface opposite to the first surface. In some embodiments, the second surface of the conductive post, the second surface of the molding compound and a surface of the connecting structure are aligned with each other.

In some embodiments, a method for manufacturing a semiconductor package is provided. The method includes following operations. A die having a first surface and a second surface opposite to the first surface is provided. A warpage control unit is disposed over the second surface of the die. The die and the warpage control unit are attached to a carrier substrate. The die and the warpage control unit are molded with a molding compound. An interconnect structure is formed over the first surface of the die and the molding compound. The warpage control unit includes a polymeric film and an adhesive film. In some embodiments, the polymeric portion is between the second surface of the die and the adhesive portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor package, comprising:
   providing a die comprising a first surface and a second surface opposite to the first surface;
   disposing a polymeric film over the second surface of the die;
   providing an adhesive film;
   attaching the die and the polymeric film to a carrier substrate through the adhesive film; and
   molding the die, the polymeric film and the adhesive film with a molding compound,
   wherein the polymeric film is sandwiched between the die and the adhesive film upon attaching to the carrier substrate, and sidewalls of the polymeric film and sidewalls of the adhesive film are in contact with the molding compound.

2. The method of claim 1, further comprising removing a portion of the die from the second surface before disposing the polymeric film.

3. The method of claim 2, wherein a thickness of the portion of the die being removed is substantially equal to a thickness of the polymeric film.

4. The method of claim 1, wherein the die comprises a first coefficient of thermal expansion (CTE), the polymeric film comprises a second CTE, the adhesive film comprises a third CTE, and the second CTE of the polymeric film is between the first CTE of the die and the third CTE of the adhesive film.

5. The method of claim 4, wherein the molding compound comprises a fourth CTE, and the second CTE of the polymeric film is closer to the fourth CTE of the molding compound than to the first CTE of the die and to the third CTE of the adhesive film.

6. The method of claim 1, wherein the adhesive film has a first surface facing the die and a second surface opposite to the first surface, and the second surface of the adhesive film aligns with a surface of the molding compound.

7. A method for manufacturing a semiconductor package, comprising:
   providing a die comprising a first surface and a second surface opposite to the first surface, wherein a connecting structure is disposed over the first surface of the die;
   forming a warpage control unit over the second surface of the die;
   attaching the die and the warpage control unit to a carrier substrate comprising at least a conductive post; and molding the die, the warpage control unit and the conductive post with a molding compound, wherein the molding compound has a first surface facing the carrier substrate and a second surface opposite to the first surface, the conductive post has a first surface facing the carrier substrate and a second surface opposite to the first surface, and the second surface of the conductive post, the second surface of the molding compound and a surface of the connecting structure are aligned with each other, a width of the connecting structure is equal to a width of the die, and sidewalls of the connecting structure are in contact with the molding compound.

8. The method of claim 7, wherein the forming of the warpage control unit further comprises:

forming a warpage adjustable portion over the second surface of the die; and forming an adhesive portion over the warpage adjustable portion.

9. The method of claim 8, wherein the die and the warpage adjustable portion are attached to the carrier substrate through the adhesive portion.

10. The method of claim 8, further comprising removing a portion of the die from the second surface before the forming of the warpage adjustable portion.

11. The method of claim 10, wherein a thickness of the portion of the die being removed is substantially equal to a thickness of the warpage adjustable portion.

12. The method of claim 8, wherein the adhesive portion has a first surface facing the die and a second surface opposite to the first surface, and the second surface of the adhesive portion is aligned with the first surface of the conductive post and the first surface of the molding.

13. The method of claim 8, wherein the die comprises a first coefficient of thermal expansion (CTE), the warpage adjustable portion comprises a second CTE, the adhesive portion comprises a third CTE, and the second CTE of the warpage adjustable portion is between the first CTE of the die and the third CTE of the adhesive portion.

14. The method of claim 13, wherein the molding compound comprises a fourth CTE, and the second CTE of the warpage adjustable portion is closer to the fourth CTE of the molding compound than to the first CTE of the die and to the third CTE of the adhesive portion.

15. A method for manufacturing a semiconductor package, comprising:

providing a die comprising a first surface and a second surface opposite to the first surface;

disposing a warpage control unit over the second surface of the die;

attaching the die and the warpage control unit to a carrier substrate;

molding the die and the warpage control unit with a molding compound; and forming an interconnect structure over the first surface of the die and the molding compound, wherein the warpage control unit comprises a polymeric film and an adhesive film, and the polymeric film is between the second surface of the die and the adhesive film.

16. The method of claim 15, further comprising:

forming a first electrical conductor over the interconnect structure; and removing the carrier substrate.

17. The method of claim 16, further comprising forming a conductive post over the carrier substrate before the attaching of the die and the warpage control unit to the carrier substrate.

18. The method of claim 17, wherein the conductive post has a first end electrically connected to the interconnect structure and a second end opposite to the first end.

19. The method of claim 18, further comprising forming a second electrical conductor over and electrically connected to the second end of the conductive post after the removing of the carrier substrate.

20. The method of claim 16, further comprising attaching the interconnect structure to a package substrate through the first electrical conductor.

* * * * *